United States Patent [19]
Mobley

[11] Patent Number: 6,064,620
[45] Date of Patent: May 16, 2000

[54] MULTI-ARRAY MEMORY DEVICE, AND ASSOCIATED METHOD, HAVING SHARED DECODER CIRCUITRY

[75] Inventor: Kenneth J. Mobley, Colorado Springs, Colo.

[73] Assignee: Enhanced Memory Systems, Inc., Colorado Springs, Colo.

[21] Appl. No.: 09/111,822

[22] Filed: Jul. 8, 1998

[51] Int. Cl.[7] ............................................ G11C 8/00
[52] U.S. Cl. .......................... 365/230.03; 365/63; 365/51
[58] Field of Search ................................. 365/230.03, 63, 365/51

[56] References Cited

U.S. PATENT DOCUMENTS

| | | | |
|---|---|---|---|
| 5,349,552 | 9/1994 | Ampaglione | 365/51 |
| 5,687,125 | 11/1997 | Kikuchi | 365/200 |
| 5,883,848 | 3/1999 | Kim et al. | 365/230.03 |

*Primary Examiner*—David Nelms
*Assistant Examiner*—Connie C Yoha
*Attorney, Agent, or Firm*—William J. Kubida, Esq.

[57] ABSTRACT

A memory device, and an associated method, contains at least two memory arrays and a single decoder shared by the memory arrays. When data is to be accessed from selected memory locations of one of the memory arrays, the non-selected memory array is inactivated by precharging the bit lines of the array to a common voltage with the data input and/or output buses for that array, thereby allowing the decoder to select the inactive array without harm, and thereby preventing the need for additional decoder circuitry to discriminate between the arrays. The array containing the selected memory locations remains active, thereby permitting accessing of the memory locations therein.

19 Claims, 3 Drawing Sheets

MULTI-ARRAY MEMORY DEVICE, AND ASSOCIATED METHOD, HAVING SHARED DECODER CIRCUITRY

The present invention relates generally to a memory device, such as a DRAM (dynamic random access memory) or EDRAM (enhanced dynamic random access memory), having memory locations forming memory arrays. More particularly, the present invention relates to a multi-array memory device, and an associated method, by which decoder circuitry of the memory device is shared by more than one memory array.

Because the bit decoder circuitry is shared by more than one memory array, separate bit decoders, conventionally associated with each memory array are not required. Thereby, the circuit area required to implement memory device is reduced relative to conventional multi-array memory devices.

Through operation of an embodiment of the present invention, when memory locations of a selected memory array of the memory device are to be accessed, such as to perform read or write operations, the selected memory array becomes or remains active. All other memory arrays are driven to be inactive while biasing the write or input/output buses of the non-selected memory arrays to an inactive-array, bit-line, precharge voltage. In such manner, extra control lines are not required to activate, or inactivate, particular ones of the memory arrays.

BACKGROUND OF THE INVENTION

The use of digital processing circuitry, and apparatus including such circuitry, to perform a wide range of functions is pervasive in modern society. Repetitive functions carried out by such circuitry can be performed at rates much more quickly than the corresponding functions performed manually. Functions can be performed, for instance, to process large amounts of data at a rapid rate. Such processing of data sometimes includes reading data from, or writing data to, memory devices.

A digital computer system, for example, includes a computer main memory which provides storage locations from which data can be read or to which data can be written. A computer main memory is typically formed of a plurality of memory devices which together form the main memory. The computer main memory, for instance, is sometimes formed of a number of asynchronous DRAM (dynamic random access memory) integrated circuits. Some conventional computer memories includes faster, SRAM (static random access memory) integrated circuits. SRAM devices permit quicker access to the memory locations thereof by making a high speed, locally-accessed copy of the memory available to the CPU (central processing unit) of the digital computer system.

Some computer systems include a computer main memory formed of EDRAM (enhanced dynamic random access memory). An EDRAM forms a memory device in which an SRAM cache component and a DRAM component are integrated onto a single integrated circuit chip. The advantages of a the improved access speeds of an SRAM device is provided to permit the CPU of the computer system to access the memory locations thereof at high access rates.

Such aforementioned memory devices are formed of memory locations which form memory arrays. The memory locations of the memory arrays are identified by memory addresses. When a memory location of a memory array is to be accessed, the address of the memory location is provided to decoder circuitry which decodes the address signals applied thereto to permit the access to the appropriate memory locations. Conventionally, separate decoder circuitry is associated with each memory array of a memory device. When memory locations of a memory array are to be accessed, address signals applied to the decoder circuitry permit the appropriate memory locations of the memory array associated with the particular decoder circuitry to be accessed.

A significant design goal in the design and implementation of an integrated circuit is the minimization of the circuit area required to implement the circuit. Any manner by which to reduce the circuit area required to implement the circuit would facilitate the miniaturization of the circuit. The conventional use of separate decoder circuitry associated with each array of a multi-array memory device requires significant circuit area for its implementation.

A manner by which to address memory locations of any selected memory array of a multi-array memory device without requiring the memory device to include separate decoder circuitry associated with each memory array would advantageously permit the reduction in circuit area required to implement the memory device. While some existing techniques have been developed which permit sharing of decoder circuitry between more than one memory array, such existing techniques typically require extra decoder circuitry, as well as extra address or command lines, to effectuate the sharing of decoder circuitry.

It is in light of this background information related to memory devices that the significant improvements of the present invention have evolved.

SUMMARY OF THE INVENTION

The present invention, accordingly, advantageously provides a multi-array, memory device, and an associated method, having bit decoder circuitry shared by more than one memory array of the memory device.

A memory device constructed according to the teachings of an embodiment of the present invention reduces the circuit area required for the implementation of the memory device as separate bit decoder circuitry need not be associated with each memory array. A single bit decoder circuit is shared by more than one memory array without the need of additional decoder circuitry or additional control lines. By removing the redundancy of the separate decoder circuitry associated with each of the memory arrays, the circuit area required to implement the memory device is reduced.

During operation of an embodiment of the present invention, when memory locations of a selected memory array of a multi-array memory device are to be accessed, any selected memory arrays becomes active, while all other memory arrays remain inactive. By biasing the write or input/output buses of the non-selected memory arrays to the same voltage as the bit lines of the non-selected memory arrays, the memory locations of only the active memory array are accessed. Extra control lines and extra control circuitry are not required.

In one implementation, an EDRAM containing multiple-writeable, memory arrays is provided. A single decoder is shared between the arrays. When write operations are to be performed upon selected memory locations of a particular one of the memory arrays, the selected memory array remains, or becomes, active while all non-selected memory arrays are caused to become inactive. The write buses of the non-selected memory arrays are set to the bit-line precharge voltage. Thereby, coupling of the buses to the bit lines through the action of the shared decoder, is not harmful, while the selected memory locations are accessed in the active array and the write operations are performed to write data to such selected memory locations.

In another implementation, a DRAM containing multiple-writeable, memory arrays is provided. A single decoder is shared between the arrays. When write operations are to be performed upon selected memory locations of a particular memory array, the selected memory array remains, or becomes, active while all non-selected memory arrays are caused to become inactive. The write buses of the non-selected memory arrays are set to the bit-line precharge voltage. Thereby, coupling of the buses to the bit lines through the action of the shared decoder is not harmful, while the selected memory locations are accessed in the active array and the write operations are performed to write data to such selected memory locations.

In these and other aspects, therefore, a memory device, and an associated method, for storing data therein is provided. The memory device includes a first memory array having a first plurality of memory locations and at least a second memory array having at least a second plurality of memory locations. A decoder is coupled to the first memory array and to the at least second memory array. The decoder is coupled also to receive indications of accessed requests to access selected memory locations of the first and at least second plurality of memory locations. The decoder circuitry selectively accesses the memory locations identified by the indications of the access requests. Biasing circuitry is coupled to the first memory array and to the at least second memory array. The biasing circuitry selectively biases the bit lines of all but a selected at least one memory array of the first memory array and the at least second memory array. The at least one selected memory array contains the selected memory locations identified in the indications of the accessed requests received by the decoder. The at least one selected memory array remains, or becomes active, and the memory locations thereof accessible. Each of the first memory array and the at least the second memory array biased by the biasing circuitry become inactive and the memory locations thereof inaccessible. The write or I/O buses of the unselected arrays are biased by similar biasing circuitry to a similar voltage so that the selection of the inactive arrays by the shared decoder is not effective or harmful.

A more complete appreciation of the present invention and to the scope thereof can be obtained from the accompanying drawings which are briefly summarized below, the following detailed description of the presently-preferred embodiments of the invention, and the appended claims.

DETAILED DESCRIPTION

Figure 1:
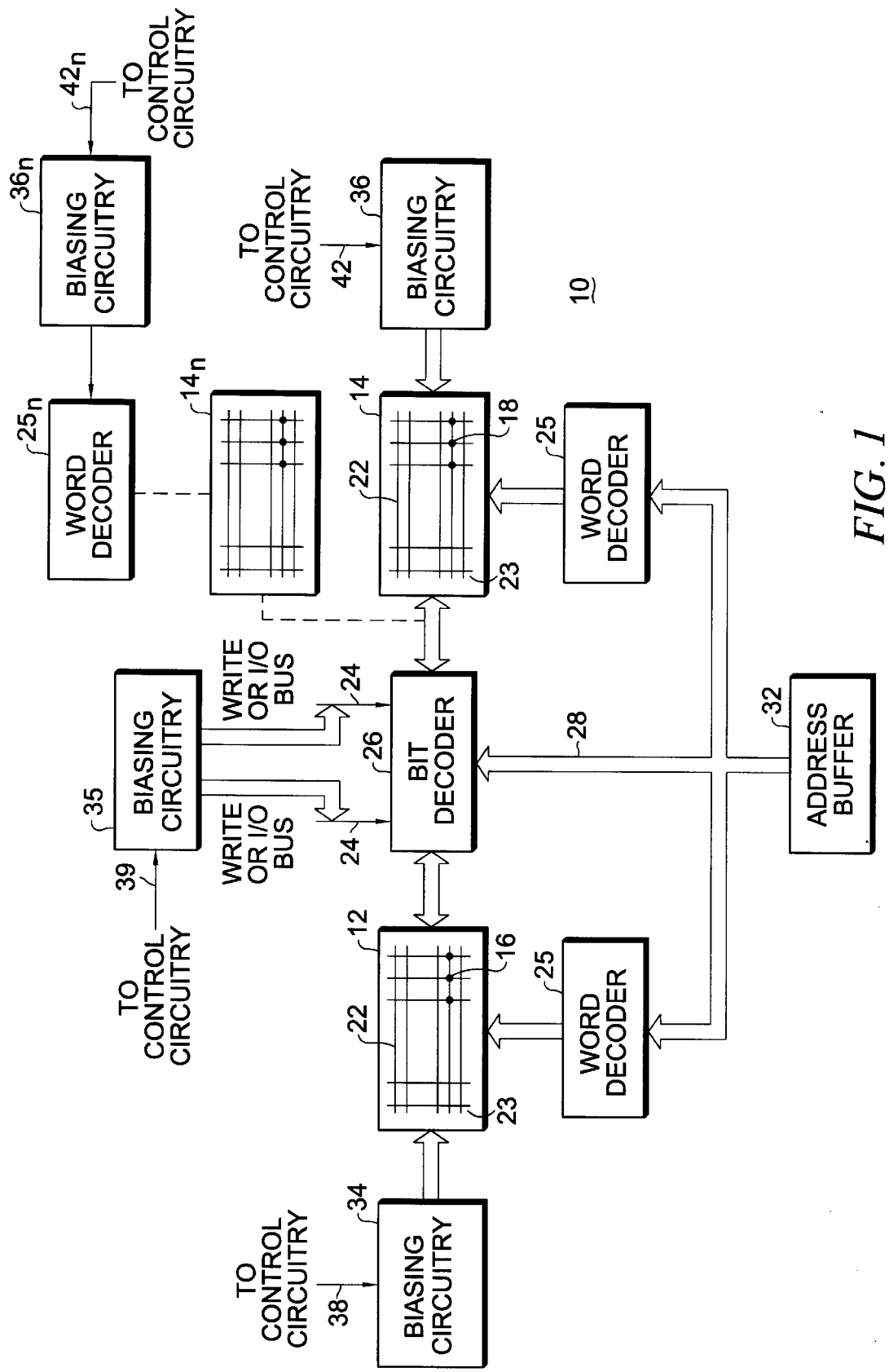
FIG. 1 illustrates a functional block diagram of a memory device of an embodiment of the present invention.

Referring first to FIG. 1, a portion of a memory device, shown generally at 10, of an embodiment of the present invention is shown. In the exemplary embodiment, the memory device 10 forms a two-array, EDRAM (enhanced dynamic random access memory) integrated circuit. In other embodiments, the memory device is formed of other types of memory devices.

Here, the memory device 10 includes a first memory array 12 and a second memory array 14. The memory arrays 12 and 14 are conventional in nature and include an array of memory locations formed of RAM (random access memory) cells, of which three cells 16 are represented in the Figure to form portions of the memory array 12. Similarly, three memory cells 18 are indicted in the Figure, exemplary of the memory cells of the memory array 14. While not separately shown, the memory arrays 12 and 14 each may include a static RAM portion and a DRAM main memory portion, integrated on a common integrated circuit chip. In conventional manner, the cells 16 and 18 are each formed to be coupled to bit lines 22 and to word lines 23.

The lines 22 and 23 of the arrays 12 and 14 are coupled to decoders 25 and 26 such that the decoder 26 is shared by both of the memory arrays. And, the decoders 25 and 26 are coupled to an address bus 28 to receive addresses identifying selected ones of the memory locations, such as the cells 16 or 18 of the arrays 12 and 14, respectively. The addresses are, for example, externally-generated and stored in the address buffer 32, thereafter to be transported by way of the address bus 28 to the decoders 25 and 26.

The biasing circuitry 34, 35 and 36, are selectably operable to bias the bit lines 22 and the input or I/O buses 24 of the decoder 26 to which the respective biasing circuitry 34, 35, and 36 is coupled. The biasing circuitry is controlled by control circuitry (not shown) by way of the lines 38, 39, and 42, respectively.

When data is to be written to selected memory locations of one or the other of the memory arrays 12 or 14, the address of the memory locations to be accessed is generated and transported upon the address bus 28 to the decoder 26. Also, the biasing circuitry 34, 35 and 36, as appropriate, biases the bit lines 22 and bus lines 24 of the memory array 12 and 14 not containing the memory locations to which data is to be written. That is to say, the memory array containing the memory locations to which data is to be written forms a selected memory array, and the remaining memory array, forms a non-selected array. The non-selected array is caused to be biased with the biasing circuitry associated therewith such that all bit lines of the non-selected memory array are charged to a voltage level corresponding to the voltage level of the data input or I/O buses of the decoder so that a voltage differential is not maintained therebetween. Without a voltage differential, the non-selected bit lines and data buses form a common nodal potential. The selected memory array remains operable in conventional manner for the memory locations thereof to be accessible to write data thereto or read data therefrom. Because the biasing circuitry 34, 35, and 36 form portions of a conventional EDRAM, or other memory device, no additional circuitry is required to inactivate non-selected memory arrays. And, because separate decoder circuitry need not be associated with each memory array, the circuit area required to implement the memory device 10 is reduced relative to conventional implementations, and without the need to provide additional decoder circuitry to inactivate one or the other of the memory arrays.

In embodiments in which the memory device 10 includes greater numbers of memory arrays (as shown by the dashed lines in FIG. 1 showing memory array $14_n$, word decoder $25_n$, biasing circuitry $36_n$, and control line $42_n$), all of the non-selected memory arrays are biased, and only the selected memory arrays contain memory locations which are accessible through operation of the decoder 26.

Figure 2:
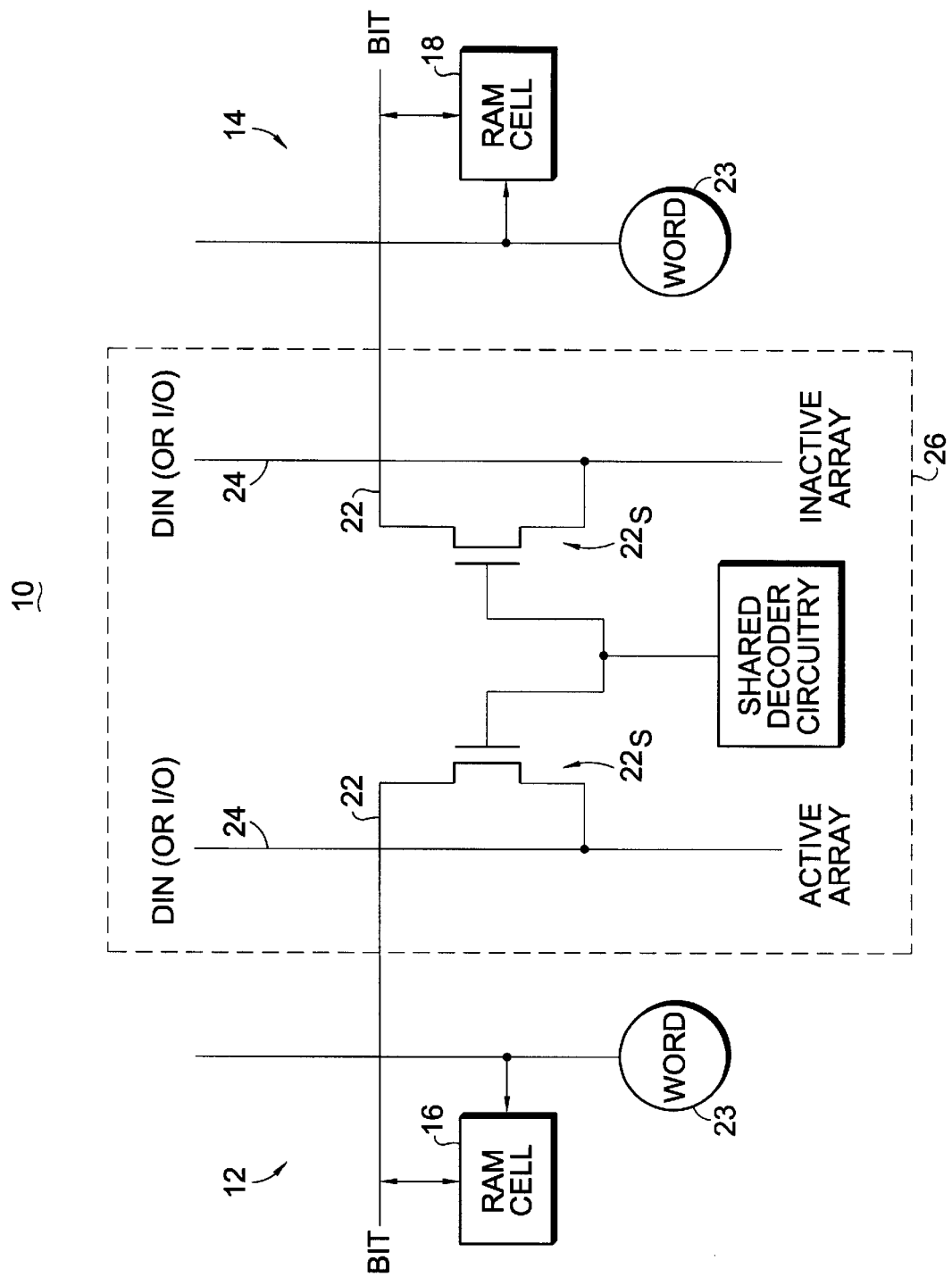
FIG. 2 illustrates a partial functional block diagram, partial circuit diagram of a portion of the memory device shown in FIG. 1.

FIG. 2 illustrates a portion of the memory device 10. Portions of the memory arrays 12 and 14 are again also shown. Here, a single memory cell 16, is illustrated at the memory array 12. The cell 16 is coupled to a word line 23 and to a bit line 22. Analogously, a single memory cell 18, is illustrated at the memory array 14. The cell 18 is coupled to a word line 23 and to a bit line 22. While not separately shown, plurality of other word lines and bit lines, and associated memory cells, form portions of the memory arrays 12 and 14.

The decoder 26 is shown to be coupled to the bit lines 22 of both of the memory arrays 12 and 14 to be shared therebetween.

In the exemplary illustration of the Figure, the memory array 12 forms the selected array while the memory array 14 is non-selected. The DIN (or I/O) line lines 24 of the memory array 14 15 driven to a voltage $V_{off}$. Driving DIN (ORI/O) line 24 of the non-selected array of turns off a switch 22S of the non-selected array, thereby to make the memory cells 18 of the memory array 14 inaccessible. The selected memory array, memory array 12, is operable in conventional manner to write or read data to or from the memory locations identified by the addresses applied to the decoder 26. Namely, appropriate ones of the word lines 23 are driven, and appropriate ones of the bit lines 22 are driven or sensed to write data to or read data from the selected ones of the cells 16 of the memory array 12.

Because unused data buses 24 are biased to the same voltage as their respective unused bit lines 22, the single decoder 26 is shared between the two memory arrays 12 and 14 without the need for additional control lines or control circuitry to activate or inactivate the non-selected memory array. Additional memory arrays can be coupled to the decoder 26 in similar fashion, thereby to share the single decoder 26 amongst more that two memory arrays.

Figure 3:
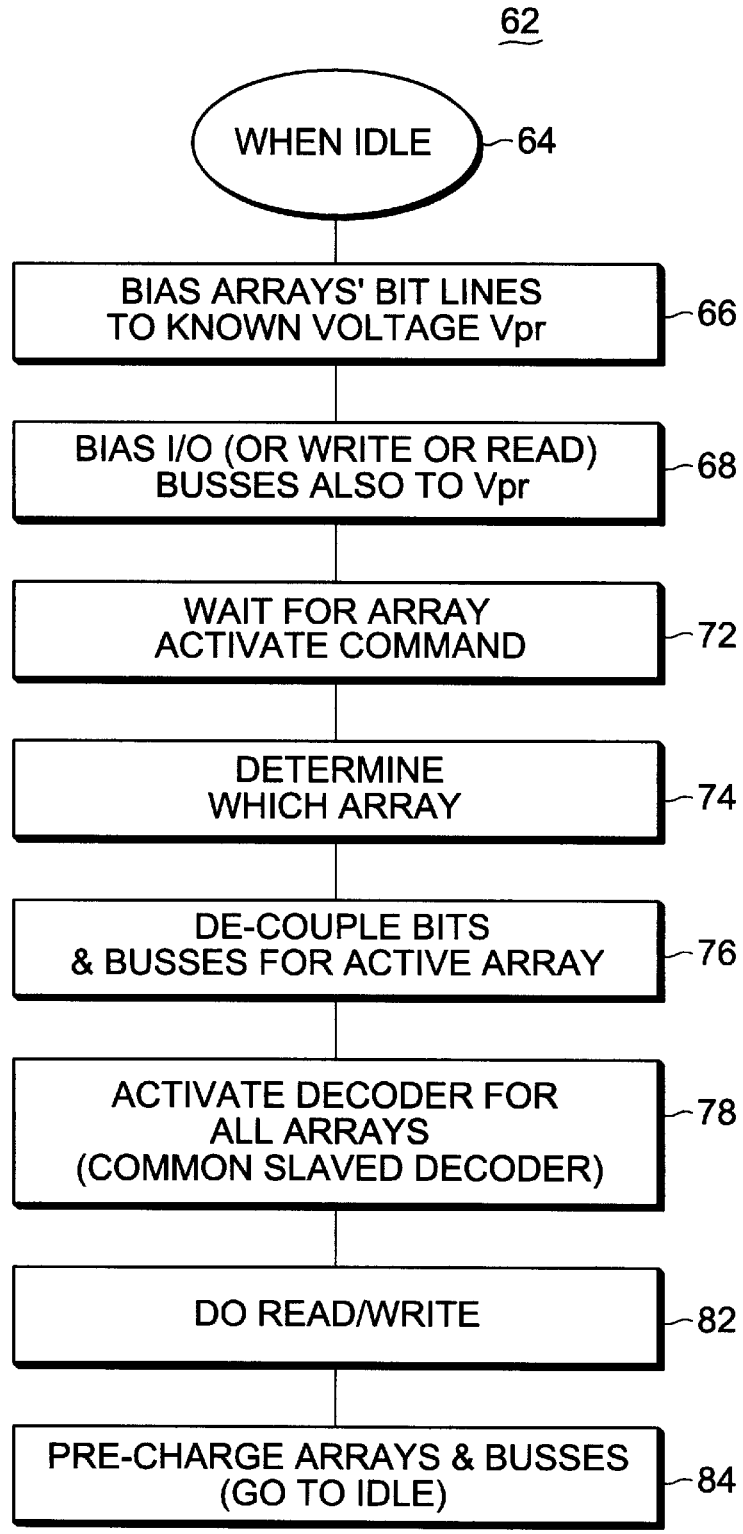
FIG. 3 illustrates a method flow diagram showing the method of operation of an embodiment of the present invention.

FIG. 3 illustrates a method, shown generally at 62, of an embodiment of the present invention. The method 62 provides a manner by which to access selected memory locations of a memory array of a multi-array memory device. The memory device includes a bit decoder which is coupled to bit lines of each memory array of the memory device. The bit decoder is utilized to access memory locations of at least a selected one of the memory arrays of the memory device.

First, and as indicated by the state 64, the memory device is initially in an idle state. Then, and as indicated by the block 66, the bit lines of the memory arrays are biased to a known voltage, $V_{PR}$.

Input/output (or read or write) buses of the memory arrays are also biased, as indicated by the block 68, to the same voltage $V_{PR}$. Thereafter, and as indicated by the block 72, the bit lines and the input/output, or read or write, buses are maintained at the bias voltage while awaiting an array activate command. Once an array activate command is generated, a determination is made, as indicated by the block 74, as to which array, or arrays, of the multi-array memory device contains memory locations which are to be accessed.

Then, and as indicated by the block 76, the bit lines and input/output, or read or write, buses of the array, or arrays, determine at the block 76 to contain the selected memory locations become decoupled from the biasing circuitry used to bias all of the bit lines and buses of the active array or arrays.

As indicated by the block 78, the common shared decoder is activated. The appropriate memory access operation, i.e., a read or write operation, is performed, as indicated by the block 82. Once the operation is completed, the bit lines and buses of the array, or arrays, are again precharged, as indicated by the block 84, and a return is made to the idle state 64.

Because only a single decoder is required to access memory locations of any selected one of a plurality of memory arrays to which the decoder is coupled, the circuit area required to implement the memory device is reduced relative to conventional devices. Such reduction in required circuit area to implement the memory device permits miniaturization of the memory device.

The previous descriptions are of preferred examples for implementing the invention, and the scope of the invention should not necessarily be limited by this description. The scope of the present invention is defined by the following claims.

I claim:

1. A memory device for storing data therein, said memory device comprising:

a first memory array having bit lines having a first plurality of memory locations;

at least a second memory array also having bit lines having at least a second plurality of memory locations;

a decoder coupled to said first memory array through a first memory array switch and said at least second memory array through an at least second memory array switch and coupled to receive indications of access requests to access selected memory locations of the first plurality of memory locations and the second plurality of memory locations, said decoder for selectively accessing the memory locations identified by the indications of the access requests; and biasing circuitry coupled to said first memory array, to said at least second memory array and to said decoder, said biasing circuitry coupled to said decoder by input lines, said biasing circuitry for selectively biasing bit lines of all but at least one selected memory array of said first memory array and said at least second memory array and for selectively biasing input lines of said decoder to selectively turn off said first memory array switch and said at least second memory array switch, the at least one selected memory array containing the selected memory locations identified in the indications of the access requests received by said decoder, the at least one selected memory array remaining active responsive to the selective biasing of the at least input lines and the bit lines thereof, and the selected memory locations thereof accessible, each of said first memory array and said at least second memory array biased by said biasing circuitry being inactive and the memory locations thereof inaccessible.

2. The memory device of claim 1 wherein said first memory array comprises a first plurality of word lines and a first plurality of the bit lines and wherein said biasing circuitry is coupled to the first plurality of the bit lines.

3. The memory device of claim 2 wherein said biasing circuitry biases all of the first plurality of the bit lines when the selected memory locations identified in the indications of the access request are located at said at least second memory array.

4. The memory device of claim 3 wherein said first memory array comprises a dynamic random access memory array.

5. The memory device of claim 4 wherein the charge level to which the biasing circuitry biases each of the bit lines is of a value corresponding to charge levels of the at least input buses of said decoder.

6. The memory device of claim 2 wherein said decoder is coupled to each of the bit lines of said first memory array.

7. The memory device of claim 1 wherein said at least second memory array comprises a second plurality of word lines and a second plurality of bit lines and wherein said biasing circuitry is coupled to the second plurality of bit lines.

8. The memory device of claim 7 wherein said biasing circuitry biases all of the second plurality of bit lines when the selected memory locations identified in the indications of the access request are located at said first memory array.

9. The memory device of claim 8 wherein said at least second memory array comprises a dynamic memory array and wherein said biasing circuitry is also coupled to each word line of said at least second memory array.

10. The memory device of claim 9 wherein the charge level to which the biasing circuitry biases each of the bit lines is of a value corresponding to charge levels of the at least input buses of said decoder.

11. The memory device of claim 7 wherein said decoder is coupled to each of the bit lines of said at least second memory array.

12. The memory device of claim 1 wherein said at least second memory array comprises a second memory array and at least a third memory array, wherein said decoder is coupled to said second memory array and to said at least third memory array, and wherein said biasing circuitry is coupled to selectively bias all but the at least one selected memory array.

13. The memory device of claim 1 wherein said decoder receives the indications of the access requests when data is to be written to the selected memory locations.

14. The memory device of claim 11 wherein each of said first memory array and said at least second memory array include a plurality of write buses and wherein the write buses of all but the selected memory array are biased by said biasing circuitry when the data is to be written to the selected memory locations.

15. A method for selectively accessing memory locations of a selected array of a multi-array memory device, said method comprising the steps of:

providing indications of access requests to a decoder, the decoder coupled to each array of the multi-array memory device through memory array switches, the access requests requesting access to selected memory locations of at least one selected array of the multi-array memory;

biasing bit lines of each array of the multi-bank memory device but the at least one selected array containing the selected memory locations to make each array but the at least one selected array inaccessible; and accessing the selected memory locations of the selected array, the selected array remaining otherwise unbiased during said step of biasing.

16. The method of claim 15 wherein each array of the multi-array memory device comprises bit lines and word lines, and wherein said step of biasing comprises biasing each of the bit lines of each array but the at least one selected array containing the selected memory locations.

17. The method of claim 16 wherein each array of the multi-array memory device comprises a dynamic array having sense amplifiers coupled to the bit lines thereof, and wherein said step of biasing comprises biasing the bit lines along with the sense amplifiers to selected charge levels.

18. The method of claim 17 wherein the charge levels to which the sense amplifiers and bit lines are biased correspond to charge levels of data buses controlled by the decoder to which the indications of the access requests are provided during said step of providing.

19. The method of claim 18 wherein each array of the multi-array memory device comprises bit lines, the decoder coupled to the bit lines of the each array, and wherein said step of accessing comprises selectively biasing selected data lines of the array containing the selected memory locations.

* * * * *